United States Patent
Hunter et al.

(10) Patent No.: US 10,211,815 B2
(45) Date of Patent: Feb. 19, 2019

(54) SYSTEMS AND METHODS FOR SUPPLYING DIFFERENT VOLTAGE LEVELS WITH SHARED CURRENT

(71) Applicant: FREESCALE SEMICONDUCTOR, INC., Austin, TX (US)

(72) Inventors: Earl K. Hunter, Gilbert, AZ (US); Miguel Mendez, Jalisco (MX); Yi Cheng Chang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 336 days.

(21) Appl. No.: 15/135,622

(22) Filed: Apr. 22, 2016

(65) Prior Publication Data
US 2017/0310307 A1    Oct. 26, 2017

(51) Int. Cl.
H03K 3/03    (2006.01)
H03K 3/012    (2006.01)
H03K 3/354    (2006.01)

(52) U.S. Cl.
CPC .......... *H03K 3/012* (2013.01); *H03K 3/0315* (2013.01); *H03K 3/354* (2013.01)

(58) Field of Classification Search
CPC ....... H03K 3/012; H03K 3/0315; H03K 3/354
See application file for complete search history.

(56) References Cited

U.S. PATENT DOCUMENTS

| | | | |
|---|---|---|---|
| 7,489,487 B2 | 2/2009 | Oka | |
| 8,174,288 B2 * | 5/2012 | Dennard | H03K 3/00 326/101 |
| 8,885,371 B2 | 11/2014 | Markowski et al. | |
| 9,018,987 B1 * | 4/2015 | Lahiri | H03K 3/0315 327/114 |
| 2017/0170722 A1 * | 6/2017 | Jung | H02M 3/07 |

OTHER PUBLICATIONS

Maekawa et al., "Design of CMOS inverter-based output buffers adapting the Cherry-Hooper broadbanding technique", IEEE—European Conference on Circuit Theory and Design, 2009, pp. 511-514.

Ren et al., "Stacked-Ring Oscillator With Reduced Phase Noise", IEEE—Canadian Conference on Electrical and computer Engineering, 2008, pp. 2057-2060.

* cited by examiner

Primary Examiner — Patrick O Neill (57) ABSTRACT

An integrated circuit includes a first portion of a stacked ring oscillator coupled between a first supply voltage node and a common node, wherein the first supply voltage node provides a local supply voltage for the first portion and the common node provides a local ground for the first portion. The integrated circuit includes a second portion of the stacked ring oscillator coupled between the common node and a second supply voltage node wherein the common node provides a local supply voltage for the second portion and the second supply voltage node provides a local ground for the second portion. The integrated circuit also includes a voltage divider having a first resistive element coupled between the first supply node and the common node and a second resistive element coupled between the common node and the second supply node.

19 Claims, 3 Drawing Sheets

SYSTEMS AND METHODS FOR SUPPLYING DIFFERENT VOLTAGE LEVELS WITH SHARED CURRENT

BACKGROUND

Field

This disclosure relates generally to power supplies, and more specifically, to supplying different voltage levels that share the same current to different circuit devices.

Related Art

With the ever increasing use of electronic devices, efficient use of available power is very important, particularly with portable devices. For example, linear voltage regulators can be inefficient due to unused power between a high input supply voltage provided to the regulator and a lower supply voltage required by circuitry powered by the regulator. Various types of analog circuitry may have different power level requirements, and it is desirable to supply voltage at the various levels required while minimizing waste of unused power.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein provide a voltage supply system with multiple supply voltage levels that share the same current. Different supply voltage levels are provided to respective sections of circuitry that require a particular level of supply voltage. Blocks of analog circuitry can be partitioned and coupled to one of the different voltage levels. A first level of supply voltage is between an input supply voltage and a midpoint common mode voltage, which serves as ground for the first level. A second level of supply voltage is between the common mode voltage and actual ground level voltage. The internal current is shared by the first and second levels.

Figure 1:
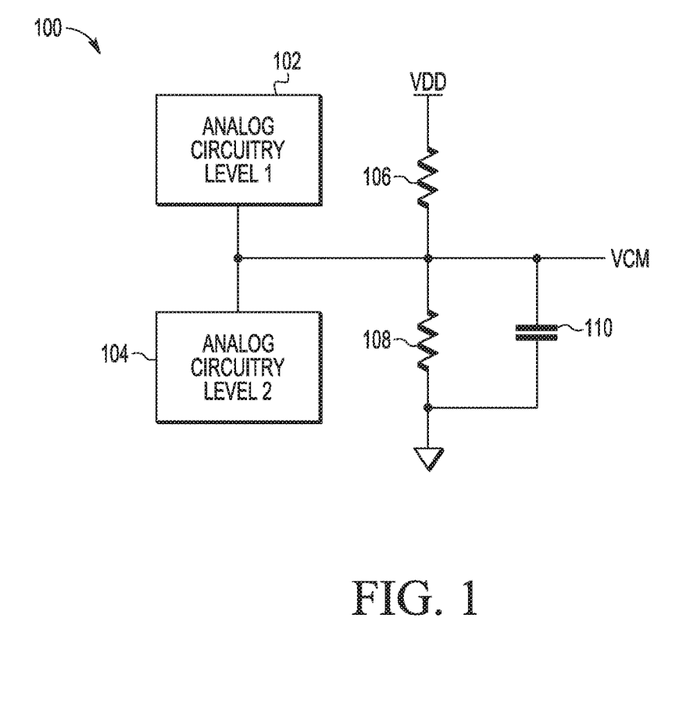
FIG. 1 is a block diagram of a voltage supply system in accordance with selected embodiments of the invention.

FIG. 1 is a block diagram of a voltage supply system 100 in accordance with selected embodiments of the invention that includes level one analog circuitry 102, level two analog circuitry 104, input supply voltage VDD, resistor divider with resistors 106, 108 coupled in series at node A between input supply voltage VDD and ground, and capacitor 110. Common mode voltage VCM is coupled to node A and between level one analog circuitry 102 and level two analog circuitry 104. Capacitor 110 includes a first terminal coupled between resistor 108 and ground, and a second terminal coupled to the common mode voltage VCM at node A. Resistors 106, 108 can have the same value so supply voltage VDD is split equally between level one circuitry 102 and level two circuitry 104. Common mode voltage VCM acts as ground voltage level for level one circuitry 102, and as input supply voltage for level two circuitry. Voltage provided to level one circuitry 102 is between supply voltage VDD and common mode voltage VCM, and voltage provided to level two circuitry 104 is between common mode voltage VCM and ground. Capacitor 110 is relatively large and may be implemented as a capacitor bank using multiple discrete capacitors which are in the order of micro-Farad (uF).

Figure 2:
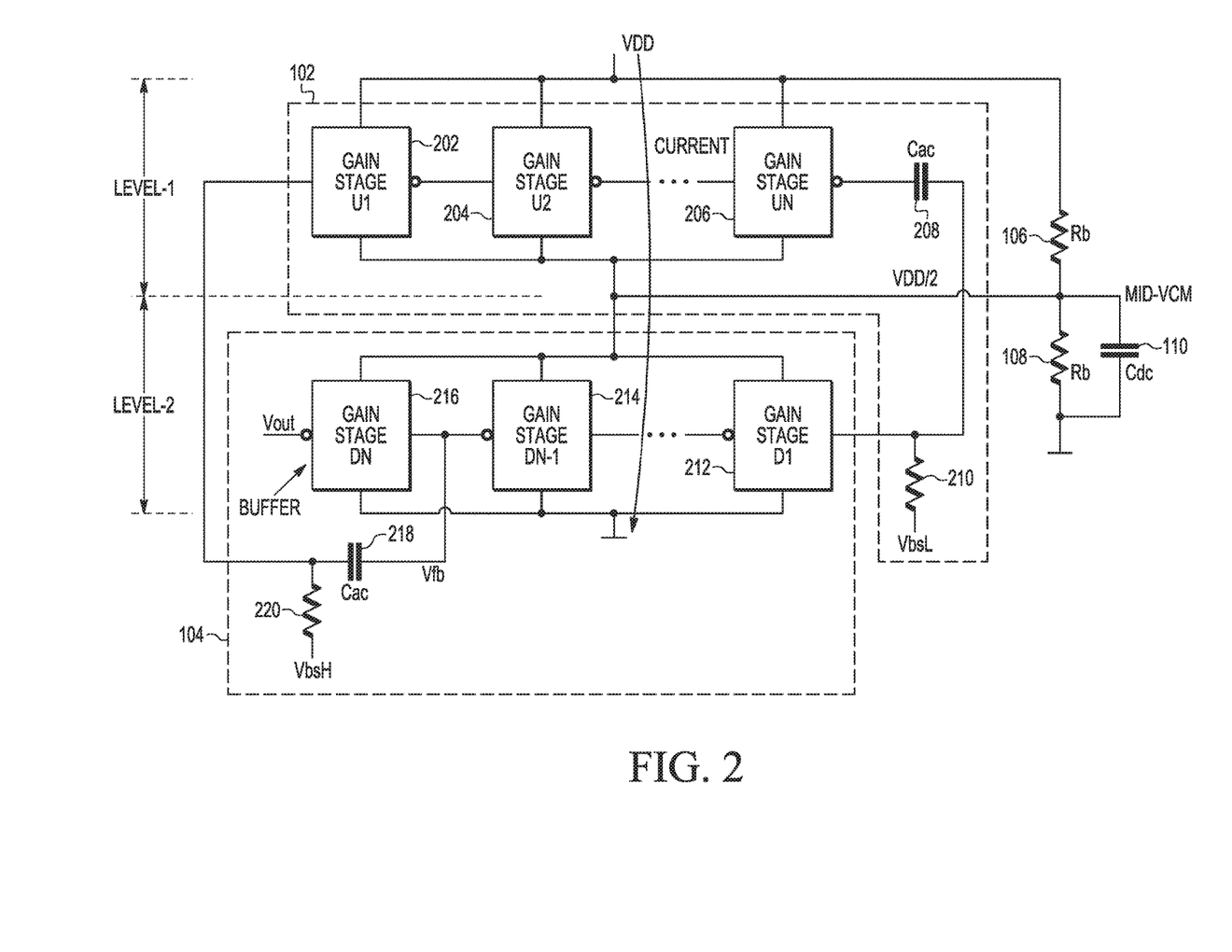
FIG. 2 is a block diagram of a low-power ring voltage controlled oscillator using the voltage supply system of FIG. 1 in accordance with selected embodiments of the invention.

Level one and level two analog circuitry 102, 104 can be any type of circuitry that require different levels of voltage during operation. As an example, FIG. 2 is a block diagram of a low-power ring voltage controlled oscillator 200 using the voltage supply system 100 of FIG. 1 in accordance with selected embodiments of the invention. Level one circuitry 102 includes a series of gain stages 202, 204, 206, capacitor 208 and resistor 210 that operate on an upper voltage level. Gain stages 202, 204, 206 are coupled in series with one another between input supply voltage VDD and common mode voltage VCM. Capacitor 208 includes a first terminal coupled to an output of gain stage 206 and a second terminal coupled to a first terminal of resistor 210 and an output of gains stage 212. Resistor 210 includes the first terminal coupled to the second terminal of capacitor 208 and the output of gain stage 212, and a second terminal coupled to the first bias voltage VbsL. Capacitor 208 and resistor 210 provide a high-pass filtering for the output of gain stage 206 before it is input to gain stage 212 of level two circuitry 104. Resistor 210 specifies a DC bias level for gain stage 212 of level two circuitry 104.

Level two circuitry 104 includes a separate series of gain stages 212, 214, 216, capacitor 218 and resistor 220 that operate on a lower voltage level than level one circuitry 102. Gain stages 212, 214, 216 are coupled in series with one another between the common mode voltage VCM and the ground. Capacitor 218 includes a first terminal coupled to an output of gain stage 214 and a second terminal coupled to an input of gain stage 202 in level one circuitry 102. Resistor 220 includes a first terminal coupled to the second terminal of capacitor 218 and a second terminal coupled to the second bias voltage VbsH. Capacitor 218 and resistor 220 provide a high-pass filtering for the output of gain stage 214 before it is input back to gain stage 202 of level one circuitry 102. Gain stage 216 acts as a buffer to maintain identical current between level one circuitry 102 and level two circuitry 104. The output of gain stage 216 is the output of ring oscillator 200. Resistor 220 and capacitor 218 decouple level two voltage from level one voltage, with resistor 220 being used to set a bias for the upper level one voltage.

Figure 3:
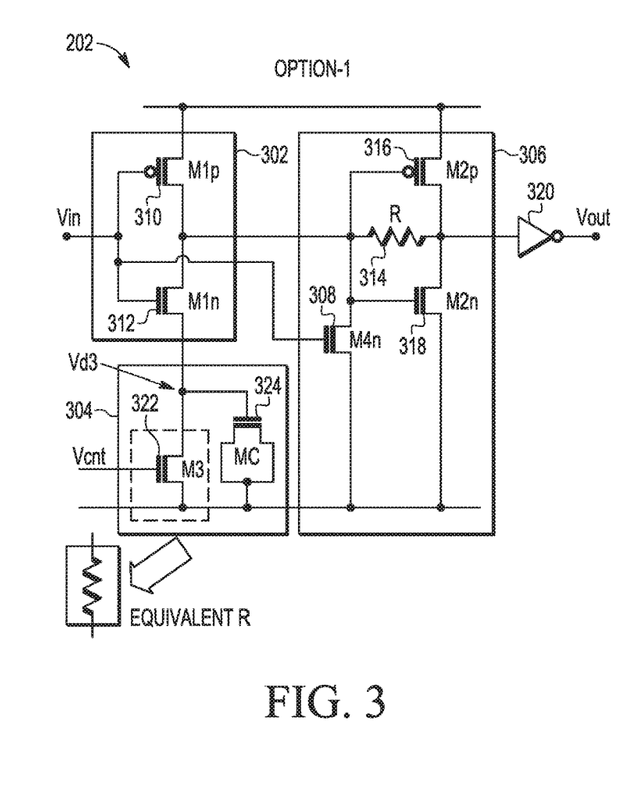
FIG. 3 is a schematic diagram of an example of a gain stage that can be used in the ring VCO of FIG. 2 in accordance with selected embodiments of the invention.

Referring to FIGS. 2 and 3, FIG. 3 is a schematic diagram of an example of gain stage 202 that can be used in the ring VCO 200 of FIG. 2 in accordance with selected embodiments of the invention. Gain stage 202 can include inverter 302 with P-channel transistor 310 and N-channel transistor 312, frequency control unit 304 including N-channel transistors 322, 324, negative resistance transistor 308, second inverter 306 including P-channel transistor 316 and N-channel transistor 318, resistor 314, and inverter 320.

In inverter 302, P-channel transistor 310 includes a first current electrode coupled to input supply voltage VDD, a second current electrode coupled to a first current electrode of N-channel transistor 312, and a gate electrode coupled to input voltage VIN, which in this example of the output of gain stage 214. N-channel transistor 312 includes a first current electrode coupled to the second current electrode of P-channel transistor 310, a second current electrode coupled to a first current electrode of transistor 322 and a gate electrode of transistor 324, and a gate electrode coupled to input voltage VIN.

In frequency control unit 304, N-channel transistor 322 includes a first current electrode coupled to the second current electrode of transistor 312 at node VD3 and the gate electrode of transistor 324, a second current electrode coupled to common mode voltage VCM, and a gate electrode coupled to a control voltage VCNT. N-channel transistor 324 includes a gate electrode coupled to the second current electrode of transistor 312 at node VD3 and the first current electrode of transistor 322, and first and second current electrodes coupled to one another and to common mode voltage VCM.

Negative resistance transistor 308 includes a gate electrode coupled to input voltage VIN, a first current electrode coupled to gate electrodes of transistors 316, 318 and to a first terminal of resistor 314, and a second current electrode coupled to common mode voltage VCM.

In second inverter 306, P-channel transistor 316 includes a first current electrode coupled to input supply voltage VDD, a second current electrode coupled to a first current electrode of N-channel transistor 318, and a gate electrode coupled to the first current electrode of transistor 308. N-channel transistor 318 includes a first current electrode coupled to the second current electrode of P-channel transistor 316, a second current electrode coupled to common mode voltage VCM, and a gate electrode coupled to the first current electrode of transistor 308.

Resistor 314 includes a first terminal coupled to the output of inverter 302 between the second current electrode of transistor 310 and the first current electrode of transistor 312, and a second terminal coupled to the output of inverter 306 between the second current electrode of transistor 316 and the first current electrode of transistor 318.

Inverter 320 includes an input coupled to the output of inverter 306 between the second current electrode of transistor 316 and the first current electrode of transistor 318, and an output VOUT that is provided to the next gain stage 204.

Note that gain stages 204, 206 can have the same structure as the example of gain stage 202 in FIG. 3. Gain stages 212, 214, 216 can have the same structure as the example of gain stage 202 in FIG. 3, however the first current electrodes of transistors 310, 316 are connected to common mode voltage VCM instead of supply voltage VDD, and the second current electrodes of transistors 322, 324, 308 and 318 are connected to ground instead of common mode voltage VCM. The output of each gain stage is provided as input to the subsequent gain stage. In the example of FIG. 2, the output of gain stage 204 is input to gain stage 206. The output of gain stage 206 is provided as input to gain stage 212, with capacitor 208 and resistor 210 providing a filter and bias setting to lower the level of the voltage input to gain stage 212. The output of gain stage 214 is provided as input to gain stage 216. Gain stage 216 is a buffer that provides the output voltage of ring oscillator 200.

Control voltage VCNT can be used to control the output impedance and ring frequency of gain stage 202. Transistors 322, 324 provide a tunable RC impedance as transistor 322 acts as an active resistor or current source and transistor 324 acts as a capacitor, which is used for ring frequency control. During operation, as VCNT goes higher, current through transistor 322 becomes larger and voltage at node VD3 is lower. Since the gate voltage at transistor 324 affects the carrier inversion conditions under a gate oxide of transistor 324, depending on the ring-frequency, the effective capacitance of transistor 324 follows unique capacitor-voltage characteristics for high or low frequency cases. Feedback transistor 308 operates as feed-forward circuitry or negative resistance circuitry, which enhances the current gain of inverter 302 and extends the bandwidth of gain stage 202.

Figure 4:
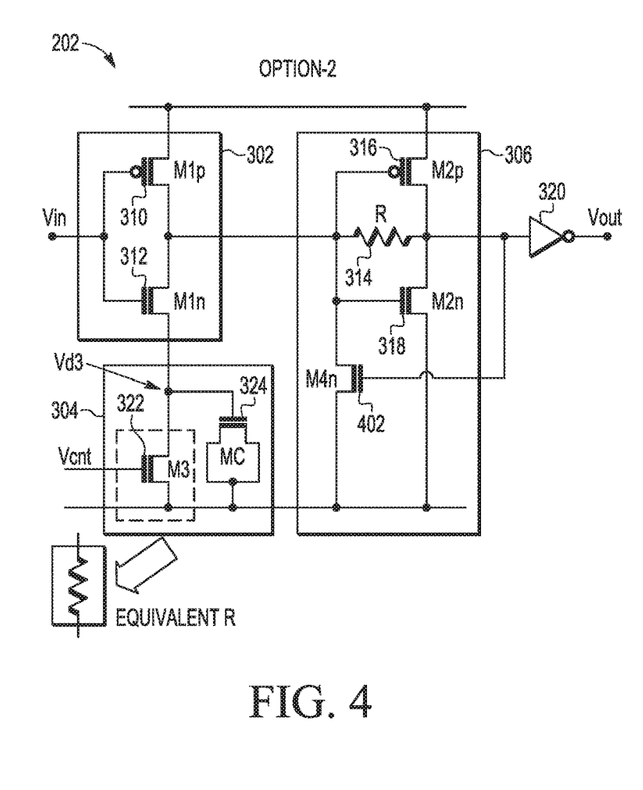
FIG. 4 is a schematic diagram of another example of a gain stage that can be used in the ring VCO of FIG. 2 in accordance with selected embodiments of the invention.

Referring to FIGS. 2 and 4, FIG. 4 is a schematic diagram of another example of a gain stage 202 that can be used in the ring VCO 200 of FIG. 2 in accordance with selected embodiments of the invention. Gain stage 202 can include inverter 302 with P-channel transistor 310 and N-channel transistor 312, frequency control unit 304 including N-channel transistors 322, 324, negative resistance transistor 402, second inverter 306 including P-channel transistor 316 and N-channel transistor 318, resistor 314, and inverter 320.

In inverter 302, P-channel transistor 310 includes a first current electrode coupled to input supply voltage VDD, a second current electrode coupled to a first current electrode of N-channel transistor 312, and a gate electrode coupled to input voltage VIN, which in this example of the output of gain stage 202. N-channel transistor 312 includes a first current electrode coupled to the second current electrode of P-channel transistor 310, a second current electrode coupled to a first current electrode of transistor 322 and a gate electrode of transistor 324, and a gate electrode coupled to input voltage VIN.

In frequency control unit 304, N-channel transistor 322 includes a first current electrode coupled to the second current electrode of transistor 312 at node VD3 and the gate electrode of transistor 324, a second current electrode coupled to common mode voltage VCM, and a gate electrode coupled to a control voltage VCNT. N-channel transistor 324 includes a gate electrode coupled to the second current electrode of transistor 312 at node VD3 and the first current electrode of transistor 322, and first and second current electrodes coupled to one another and to common mode voltage VCM.

Negative resistance transistor 402 includes a gate electrode coupled to the output of inverter 306, a first current electrode coupled to gate electrodes of transistors 316, 318 and to a first terminal of resistor 314, and a second current electrode coupled to common mode voltage VCM.

In second inverter 306, P-channel transistor 316 includes a first current electrode coupled to input supply voltage VDD, a second current electrode coupled to a first current electrode of N-channel transistor 318, and a gate electrode coupled to the first current electrode of transistor 402. N-channel transistor 318 includes a first current electrode coupled to the second current electrode of P-channel transistor 316, a second current electrode coupled to common mode voltage VCM, and a gate electrode coupled to the first current electrode of transistor 402.

Resistor 314 includes a first terminal coupled to the output of inverter 302 between the second current electrode of transistor 310 and the first current electrode of transistor 312, and a second terminal coupled to the output of inverter 306 between the second current electrode of transistor 316 and the first current electrode of transistor 318.

Inverter 320 includes an input coupled to the output of inverter 306 between the second current electrode of transistor 316 and the first current electrode of transistor 318, and an output VOUT that is provided to the next gain stage 204.

Note that gain stages 204, 206 can have the same structure as the example of gain stage 202 in FIG. 4. Gain stages 212, 214, 216 can have the same structure as the example of gain stage 202 in FIG. 4, however the first current electrodes of transistors 310, 316 are connected to common mode voltage VCM instead of supply voltage VDD, and the second current electrodes of transistors 322, 324, 402 and 318 are connected to ground instead of common mode voltage VCM. The output of each gain stage is provided as input to the subsequent gain stage. In the example of FIG. 2, the output of gain stage 204 is input to gain stage 206. The output of gain stage 206 is provided as input to gain stage 212, with capacitor 208 and resistor 210 providing a filter and bias setting to lower the level of the voltage input to gain stage 212. The output of gain stage 214 is provided as input to gain stage 216. Gain stage 216 is a buffer that provides the output voltage of ring oscillator 200.

Control voltage VCNT can be used to control the output impedance and ring frequency of gain stage 202. Transistors 322, 324 provide a tunable RC impedance as transistor 322 acts as an active resistor or current source and transistor 324 acts as a capacitor, which is used for ring frequency control. During operation, as VCNT goes higher, current through transistor 322 becomes larger and voltage at node VD3 is lower. Since the gate voltage at transistor 324 affects the carrier inversion conditions under a gate oxide of transistor 324, depending on the ring-frequency, the effective capacitance of transistor 324 follows unique capacitor-voltage characteristics for high or low frequency cases. Feedback transistor 402 operates as feed-forward circuitry or negative resistance circuitry, which enhances the current gain of inverter 302 and extends the bandwidth of gain stage 202.

By now it should be appreciated that in some embodiments there has been provided an integrated circuit that can include a first portion (102) of a stacked ring oscillator coupled between a first supply voltage node (Vdd) and a common node (mid-Vcm), wherein the first supply voltage node provides a local supply voltage for the first portion and the common node provides a local ground for the first portion; a second portion (104) of the stacked ring oscillator coupled between the common node and a second supply voltage node (gnd) wherein the common node provides a local supply voltage for the second portion and the second supply voltage node provides a local ground for the second portion; and a voltage divider having a first resistive element (106) coupled between the first supply node and the common node and a second resistive element (108) coupled between the common node and the second supply node.

In another aspect, the integrated circuit can further comprise a capacitor (110) coupled between the common node and the second supply voltage node.

In another aspect, the first and second resistive elements have equal resistance.

In another aspect, each of the first portion and the second portion comprises a plurality of gain stages.

In another aspect, the integrated circuit can further comprise a first capacitor (208) coupled between an output of a last gain stage (206) of the first portion and an input of a first gain stage (212) of the second portion; a third resistive element (210) coupled between the input of the first gain stage of the second portion and a first bias voltage node (Vbsl); a second capacitor (218) coupled between an output of a second-to-last (214) gain stage of the second portion to an input of a first gain stage (202) of the first portion; and a fourth resistive element (220) coupled between the input of the first gain stage of the first portion and a second bias voltage node (Vbsh).

In another aspect, each gain stage of the plurality of gain stages in the first portion can comprise a first transistor (302) of a first conductivity type having a first current electrode coupled to the first supply voltage node, a second current electrode, and a control electrode coupled to receive an input of the gain stage; a second transistor (312) of a second conductivity type opposite the first conductivity type having a first current electrode coupled to the second current electrode of the first transistor; a second current electrode coupled to a first internal node; and a control electrode coupled to receive the input of the gain stage; a third transistor (322) of the second conductivity type having a first current electrode coupled to the first internal node, a control electrode coupled to receive a control voltage (Vcnt), and a second current electrode coupled to the common node; and a MOS capacitor (324) having a control electrode coupled to the first internal node, and first and second current electrodes coupled to the common node.

In another aspect, each gain stage of the plurality of gain stages in the first portion can further comprise a fourth transistor (306) of the first conductivity type having a first current electrode coupled to the first supply voltage node, a control electrode coupled to a first terminal of a third resistive element (314) and the second current electrode of the first transistor, and a second current electrode coupled to a second terminal of the third resistive element; a fifth transistor (318) of the second conductivity type having a first current electrode coupled to the second current electrode of the fourth transistor; a second current electrode coupled to the common node; and a control electrode coupled to the control electrode of the fourth transistor; and a sixth transistor (308) of the second conductivity type having a first current electrode coupled to control electrode of the fifth transistor, a control electrode, and a second current electrode coupled to the common node.

In another aspect, each gain stage of the plurality of gain stages in the first portion further comprises an inverter (320) having an input coupled to the second current electrode of the fourth transistor and an output coupled to provide an output of the gain stage.

In another aspect, in each gain stage of the plurality of gain stages in the first portion, the control electrode of the sixth transistor (308—FIG. 3) can be coupled to the input of the gain stage.

In another aspect, in each gain stage of the plurality of gain stages in the first portion, the control electrode of the sixth transistor (308—FIG. 4) can be coupled to the second current electrode of the fourth transistor.

In another aspect, the control electrode of each third transistor in the plurality of gain stages in the first portion can be coupled to receive the control voltage.

In another aspect, the control voltage can control a frequency of the ring oscillator.

In another aspect, in each gain stage of the plurality of gain stages in the first portion, the first and second transistors form inverting circuitry, and the sixth transistor can be configured as feed-forward circuitry to enhance a current gain of the inverting circuitry In another aspect, each gain stage of the plurality of gain stages in the second portion can comprise a seventh transistor (302) of the first conductivity type having a first current electrode coupled to the common node, a second current electrode, and a control electrode coupled to receive an input of the gain stage; an eighth transistor (312) of the second conductivity type having a first current electrode coupled to the second current electrode of the seventh transistor; a second current electrode coupled to a second internal node; and a control electrode coupled to receive the input of the gain stage; a ninth transistor (322) of the second conductivity type having a first current electrode coupled to the second internal node, a control electrode coupled to receive the control voltage, and a second current electrode coupled to the second supply voltage node; and a second MOS capacitor (324) having a control electrode coupled to the second internal node, and first and second current electrodes coupled to the second supply voltage node.

In another aspect, each gain stage of the plurality of gain stages in the second portion can further comprise a tenth transistor (306) of the first conductivity type having a first current electrode coupled to the common node, a control electrode coupled to a first terminal of a fourth resistive element and the second current electrode of the seventh transistor, and a second current electrode coupled to a second terminal of the fourth resistive element; an eleventh transistor (318) of the second conductivity type having a first current electrode coupled to the second current electrode of the tenth transistor; a second current electrode coupled to the second supply voltage node; and a control electrode coupled to the control electrode of the tenth transistor; a twelfth transistor (308) of the second conductivity type having a first current electrode coupled to control electrode of the eleventh transistor, a control electrode, and a second current electrode coupled to the second supply voltage node; and a second inverter (320) having an input coupled to the second current electrode of the tenth transistor and an output coupled to provide an output of the gain stage.

In other selected embodiments, an integrated circuit can comprise a first plurality of gain stages (102) of a stacked ring oscillator coupled between a first supply voltage node and a common node, wherein the first supply voltage node provides a local supply voltage for the first plurality of gain stages and the common node provides a local ground for the first plurality of gain stages; a second plurality of gain stages (104) of the stacked ring oscillator coupled between the common node and a second supply voltage node wherein the common node provides a local supply voltage for the second plurality of gain stages and the second supply voltage node provides a local ground for the second plurality of gain stages; and a voltage setting circuit coupled between the first and second supply voltage nodes and configured to set the common node to a common voltage that is between voltages supplied by the first and second voltage supply nodes.

In another aspect, each gain stage of the first plurality of gain stages can comprise a first transistor (310) of a first conductivity type having a first current electrode coupled to the first supply voltage node, a second current electrode, and a control electrode coupled to receive an input of the gain stage; a second transistor (312) of a second conductivity type opposite the first conductivity type having a first current electrode coupled to the second current electrode of the first transistor; a second current electrode coupled to a first internal node; and a control electrode coupled to receive the input of the gain stage; a third transistor (322) of the second conductivity type have a first current electrode coupled to the first internal node, a control electrode coupled to receive a control voltage, and a second current electrode coupled to the common node; a MOS capacitor (324) having a control electrode coupled to the first internal node, and first and second current electrodes coupled to the common node; a fourth transistor (316) of the first conductivity type having a first current electrode coupled to the first supply voltage node, a control electrode coupled to a first terminal of a resistor and the second current electrode of the first transistor, and a second current electrode coupled to a second terminal of the resistor; a fifth transistor (318) of the second conductivity type having a first current electrode coupled to the second current electrode of the fourth transistor; a second current electrode coupled to the common node; and a control electrode coupled to the control electrode of the fourth transistor; a sixth transistor (308) of the second conductivity type having a first current electrode coupled to control electrode of the fifth transistor, a control electrode, and a second current electrode coupled to the common node; and an inverter (320) having an input coupled to the second current electrode of the fourth transistor and an output coupled to provide an output of the gain stage.

In another aspect, each gain stage of the second plurality of gain stages can comprise a seventh transistor (310) of the first conductivity type having a first current electrode coupled to the common node, a second current electrode, and a control electrode coupled to receive an input of the gain stage; an eighth transistor (312) of the second conductivity type having a first current electrode coupled to the second current electrode of the seventh transistor; a second current electrode coupled to a second internal node; and a control electrode coupled to receive the input of the gain stage; a ninth transistor (322) of the second conductivity type have a first current electrode coupled to the second internal node, a control electrode coupled to receive the control voltage, and a second current electrode coupled to the second supply voltage node; a second MOS capacitor (324) having a control electrode coupled to the second internal node, and first and second current electrodes coupled to the second supply voltage node; a tenth transistor (316) of the first conductivity type having a first current electrode coupled to the common node, a control electrode coupled to a first terminal of a second resistor and the second current electrode of the seventh transistor, and a second current electrode coupled to a second terminal of the second resistor; an eleventh transistor (318) of the second conductivity type having a first current electrode coupled to the second current electrode of the tenth transistor; a second current electrode coupled to the second supply voltage node; and a control electrode coupled to the control electrode of the tenth transistor; a twelfth transistor (308) of the second conductivity type have a first current electrode coupled to control electrode of the eleventh transistor, a control electrode, and a second current electrode coupled to the second supply voltage node; and a second inverter (320) having an input coupled to the second current electrode of the tenth transistor and an output coupled to provide an output of the gain stage.

In further selected embodiments, an integrated circuit can comprise a first analog circuit block (102) coupled between a first supply voltage node and a common node, wherein the first supply voltage node provides a local supply voltage for the first analog circuit block and the common node provides a local ground for the first analog block; a second analog circuit block (104) coupled between the common node and the second supply voltage terminal, wherein the common node provides a local supply voltage for the second analog circuit block and the second supply voltage node provides a local ground for the second analog block; a voltage divider having a first resistive element (106) coupled between the first supply node and the common node and a second resistive element (108) coupled between the common node and the second supply node; and a capacitor (110) coupled between the common node and the second supply voltage node.

In another aspect, the first and second analog circuit blocks can be configured to share a same internal current provided through the common node.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a first portion of a stacked ring oscillator coupled between a first supply voltage node and a common node, wherein the first supply voltage node provides a local supply voltage for the first portion and the common node provides a local ground for the first portion;
   a second portion of the stacked ring oscillator coupled between the common node and a second supply voltage node wherein the common node provides a local supply voltage for the second portion and the second supply voltage node provides a local ground for the second portion;
   a voltage divider having a first resistive element coupled between the first supply node and the common node and a second resistive element coupled between the common node and the second supply node;
   each of the first portion and the second portion comprises a plurality of gain stages;
   a first capacitor coupled between an output of a last gain stage of the first portion and an input of a first gain stage of the second portion; and
   a third resistive element coupled between the input of the first gain stage of the second portion and a first bias voltage node.

2. The integrated circuit of claim 1 further comprising:
   a capacitor coupled between the common node and the second supply voltage node.

3. The integrated circuit of claim 1, wherein the first and second resistive elements have equal resistance.

4. The integrated circuit of claim 1, further comprising:
   a second capacitor coupled between an output of a second-to-last gain stage of the second portion to an input of a first gain stage of the first portion; and
   a fourth resistive element coupled between the input of the first gain stage of the first portion and a second bias voltage node.

5. The integrated circuit of claim 1, wherein each gain stage of the plurality of gain stages in the first portion comprises:
   a first transistor of a first conductivity type having a first current electrode coupled to the first supply voltage node, a second current electrode, and a control electrode coupled to receive an input of the gain stage;
   a second transistor of a second conductivity type opposite the first conductivity type having a first current electrode coupled to the second current electrode of the first transistor; a second current electrode coupled to a first internal node; and a control electrode coupled to receive the input of the gain stage;
   a third transistor of the second conductivity type having a first current electrode coupled to the first internal node, a control electrode coupled to receive a control voltage, and a second current electrode coupled to the common node; and
   a MOS capacitor having a control electrode coupled to the first internal node, and first and second current electrodes coupled to the common node.

6. The integrated circuit of claim 5, wherein each gain stage of the plurality of gain stages in the first portion further comprises:
   a fourth transistor of the first conductivity type having a first current electrode coupled to the first supply voltage node, a control electrode coupled to a first terminal of a third resistive element and the second current electrode of the first transistor, and a second current electrode coupled to a second terminal of the third resistive element;
   a fifth transistor of the second conductivity type having a first current electrode coupled to the second current electrode of the fourth transistor; a second current electrode coupled to the common node; and a control electrode coupled to the control electrode of the fourth transistor; and
   a sixth transistor of the second conductivity type having a first current electrode coupled to control electrode of the fifth transistor, a control electrode, and a second current electrode coupled to the common node.

7. The integrated circuit of claim 6, wherein each gain stage of the plurality of gain stages in the first portion further comprises an inverter having an input coupled to the second current electrode of the fourth transistor and an output coupled to provide an output of the gain stage.

8. The integrated circuit of claim 7, wherein each gain stage of the plurality of gain stages in the second portion comprises:
   a seventh transistor of the first conductivity type having a first current electrode coupled to the common node, a second current electrode, and a control electrode coupled to receive an input of the gain stage;
   an eighth transistor of the second conductivity type having a first current electrode coupled to the second current electrode of the seventh transistor; a second current electrode coupled to a second internal node; and a control electrode coupled to receive the input of the gain stage;

a ninth transistor of the second conductivity type having a first current electrode coupled to the second internal node, a control electrode coupled to receive the control voltage, and a second current electrode coupled to the second supply voltage node; and a second MOS capacitor having a control electrode coupled to the second internal node, and first and second current electrodes coupled to the second supply voltage node.

9. The integrated circuit of claim 8, wherein each gain stage of the plurality of gain stages in the second portion further comprises:

a tenth transistor of the first conductivity type having a first current electrode coupled to the common node, a control electrode coupled to a first terminal of a fourth resistive element and the second current electrode of the seventh transistor, and a second current electrode coupled to a second terminal of the fourth resistive element;

an eleventh transistor of the second conductivity type having a first current electrode coupled to the second current electrode of the tenth transistor; a second current electrode coupled to the second supply voltage node; and a control electrode coupled to the control electrode of the tenth transistor;

a twelfth transistor of the second conductivity type having a first current electrode coupled to control electrode of the eleventh transistor, a control electrode, and a second current electrode coupled to the second supply voltage node; and a second inverter having an input coupled to the second current electrode of the tenth transistor and an output coupled to provide an output of the gain stage.

10. The integrated circuit of claim 6, wherein in each gain stage of the plurality of gain stages in the first portion, the control electrode of the sixth transistor is coupled to the input of the gain stage.

11. The integrated circuit of claim 6, wherein in each gain stage of the plurality of gain stages in the first portion, the control electrode of the sixth transistor is coupled to the second current electrode of the fourth transistor.

12. The integrated circuit of claim 6, wherein in each gain stage of the plurality of gain stages in the first portion, the first and second transistors form inverting circuitry, and the sixth transistor is configured as feed-forward circuitry to enhance a current gain of the inverting circuitry.

13. The integrated circuit of claim 5, wherein the control electrode of each third transistor in the plurality of gain stages in the first portion is coupled to receive the control voltage.

14. The integrated circuit of claim 13, wherein the control voltage controls a frequency of the ring oscillator.

15. An integrated circuit comprising:

a first plurality of gain stages of a stacked ring oscillator coupled between a first supply voltage node and a common node, wherein the first supply voltage node provides a local supply voltage for the first plurality of gain stages and the common node provides a local ground for the first plurality of gain stages;

a second plurality of gain stages of the stacked ring oscillator coupled between the common node and a second supply voltage node wherein the common node provides a local supply voltage for the second plurality of gain stages and the second supply voltage node provides a local ground for the second plurality of gain stages;

a voltage setting circuit coupled between the first and second supply voltage nodes and configured to set the common node to a common voltage that is between voltages supplied by the first and second voltage supply nodes;

a first capacitor coupled between an output of a last gain stage of the first plurality of gain stages and an input of a first gain stage of the second plurality of gain stages; and a third resistive element coupled between the input of the first gain stage of the second plurality of gain stages and a first bias voltage node.

16. The integrated circuit of claim 15, wherein each gain stage of the first plurality of gain stages comprises:

a first transistor of a first conductivity type having a first current electrode coupled to the first supply voltage node, a second current electrode, and a control electrode coupled to receive an input of the gain stage;

a second transistor of a second conductivity type opposite the first conductivity type having a first current electrode coupled to the second current electrode of the first transistor; a second current electrode coupled to a first internal node; and a control electrode coupled to receive the input of the gain stage;

a third transistor of the second conductivity type have a first current electrode coupled to the first internal node, a control electrode coupled to receive a control voltage, and a second current electrode coupled to the common node;

a MOS capacitor having a control electrode coupled to the first internal node, and first and second current electrodes coupled to the common node;

a fourth transistor of the first conductivity type having a first current electrode coupled to the first supply voltage node, a control electrode coupled to a first terminal of a resistor and the second current electrode of the first transistor, and a second current electrode coupled to a second terminal of the resistor;

a fifth transistor of the second conductivity type having a first current electrode coupled to the second current electrode of the fourth transistor; a second current electrode coupled to the common node; and a control electrode coupled to the control electrode of the fourth transistor;

a sixth transistor of the second conductivity type having a first current electrode coupled to control electrode of the fifth transistor, a control electrode, and a second current electrode coupled to the common node; and an inverter having an input coupled to the second current electrode of the fourth transistor and an output coupled to provide an output of the gain stage.

17. The integrated circuit of claim 16, wherein each gain stage of the second plurality of gain stages comprises:

a seventh transistor of the first conductivity type having a first current electrode coupled to the common node, a second current electrode, and a control electrode coupled to receive an input of the gain stage;

an eighth transistor of the second conductivity type having a first current electrode coupled to the second current electrode of the seventh transistor; a second current electrode coupled to a second internal node; and a control electrode coupled to receive the input of the gain stage;

a ninth transistor of the second conductivity type have a first current electrode coupled to the second internal node, a control electrode coupled to receive the control voltage, and a second current electrode coupled to the second supply voltage node;

a second MOS capacitor having a control electrode coupled to the second internal node, and first and second current electrodes coupled to the second supply voltage node;

a tenth transistor of the first conductivity type having a first current electrode coupled to the common node, a control electrode coupled to a first terminal of a second resistor and the second current electrode of the seventh transistor, and a second current electrode coupled to a second terminal of the second resistor;

an eleventh transistor of the second conductivity type having a first current electrode coupled to the second current electrode of the tenth transistor; a second current electrode coupled to the second supply voltage node; and a control electrode coupled to the control electrode of the tenth transistor;

a twelfth transistor of the second conductivity type have a first current electrode coupled to control electrode of the eleventh transistor, a control electrode, and a second current electrode coupled to the second supply voltage node; and a second inverter having an input coupled to the second current electrode of the tenth transistor and an output coupled to provide an output of the gain stage.

18. An integrated circuit comprising:

a first analog circuit block coupled between a first supply voltage node and a common node, wherein the first supply voltage node provides a local supply voltage for the first analog circuit block and the common node provides a local ground for the first analog block;

a second analog circuit block coupled between the common node and the second supply voltage terminal, wherein the common node provides a local supply voltage for the second analog circuit block and the second supply voltage node provides a local ground for the second analog block;

a voltage divider having a first resistive element coupled between the first supply node and the common node and a second resistive element coupled between the common node and the second supply node;

a capacitor coupled between the common node and the second supply voltage node;

each of the first analog circuit block and the second analog circuit block comprises a plurality of gain stages;

a first capacitor coupled between an output of a last gain stage of the first analog circuit block and an input of a first gain stage of the second analog circuit block; and a third resistive element coupled between the input of the first gain stage of the second analog circuit block and a first bias voltage node.

19. The integrated circuit of claim 18, wherein the first and second analog circuit block are configured to share a same internal current provided through the common node.

* * * * *